US008207519B2

(12) United States Patent
Nickel et al.

(10) Patent No.: US 8,207,519 B2
(45) Date of Patent: Jun. 26, 2012

(54) IONIC-MODULATED DOPANT PROFILE CONTROL IN NANOSCALE SWITCHING DEVICES

(75) Inventors: Janice H Nickel, Sunnyvale, CA (US); Michael Renne Ty Tan, Menlo Park, CA (US); Zhiyong Li, Redwood City, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 162 days.

(21) Appl. No.: 12/763,091

(22) Filed: Apr. 19, 2010

(65) Prior Publication Data

US 2011/0253966 A1 Oct. 20, 2011

(51) Int. Cl.
*H01L 47/00* (2006.01)
*H01L 21/332* (2006.01)
*G11C 13/00* (2006.01)

(52) U.S. Cl. ............. 257/4; 257/E27.004; 257/E45.002; 257/E21.003; 438/133; 365/151

(58) Field of Classification Search ................ 257/4, 5, 257/E45.002, E27.004, E21.003, 1, 48; 438/104, 438/99, 133, 134; 365/151
See application file for complete search history.

(56) References Cited

U.S. PATENT DOCUMENTS

| 7,741,638 B2 * | 6/2010 | Stewart et al. ................ 257/48 |
| 2007/0228353 A1 * | 10/2007 | Teeters ............................ 257/1 |
| 2011/0266513 A1 * | 11/2011 | Williams et al. ................ 257/4 |

* cited by examiner

*Primary Examiner* — A. Sefer
*Assistant Examiner* — Nikolay Yushin
(74) *Attorney, Agent, or Firm* — David W. Collins

(57) ABSTRACT

A nanoscale switching device is provided, comprising: a first electrode of a nanoscale width; a second electrode of a nanoscale width; an active region disposed between the first and second electrodes, the active region having at least one non-conducting layer comprising an electronically semiconducting or nominally insulating and a weak ionic conductor switching material capable of carrying a species of dopants and transporting the dopants under an electric field; and a source layer interposed between the first electrode and the second electrode and comprising a highly reactive and highly mobile ionic species that reacts with a component in the switching material to create dopants that are capable of drifting through the non-conducting layer under an electric field, thereby controlling dopant profile by ionic modulation. A crossbar array comprising a plurality of the nanoscale switching devices is also provided, along with a process for making at least one nanoscale switching device.

19 Claims, 4 Drawing Sheets

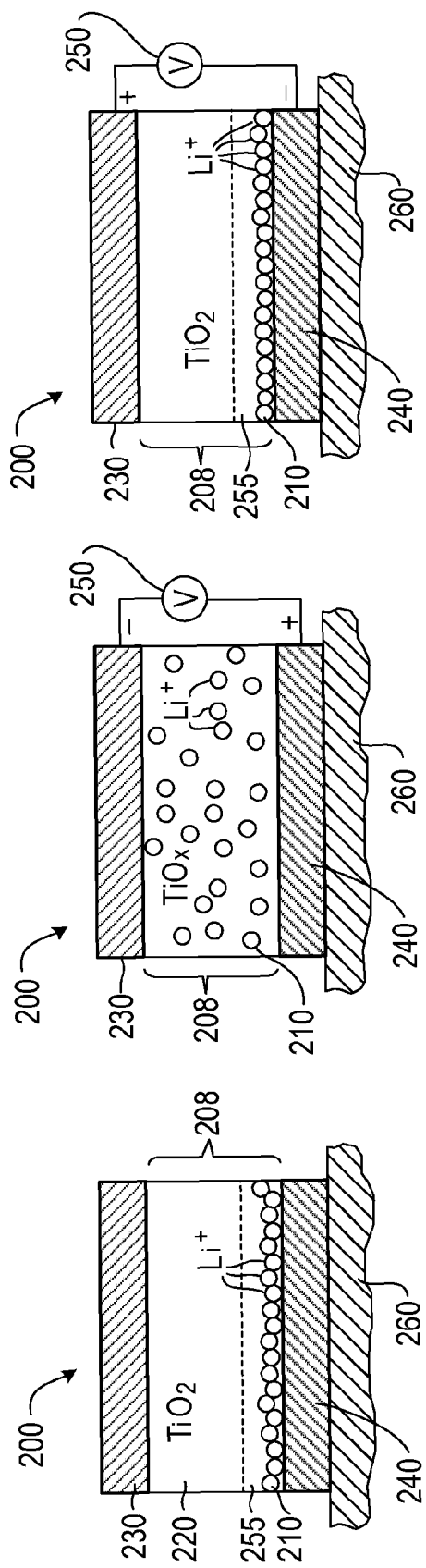

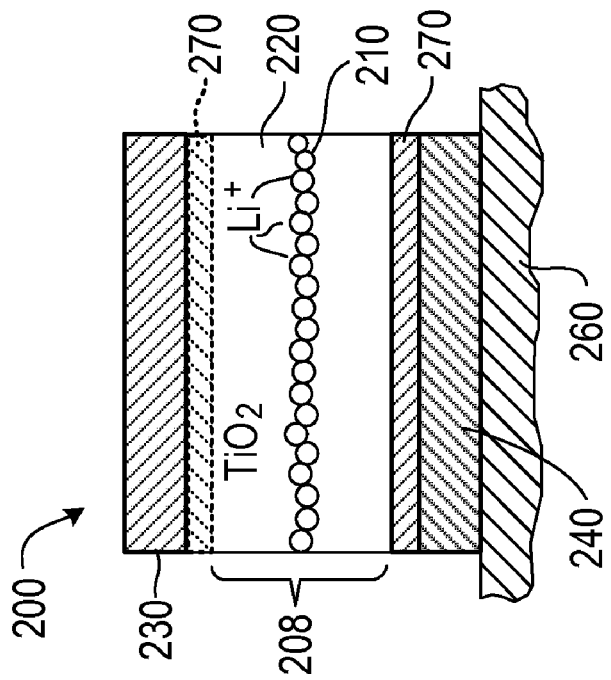
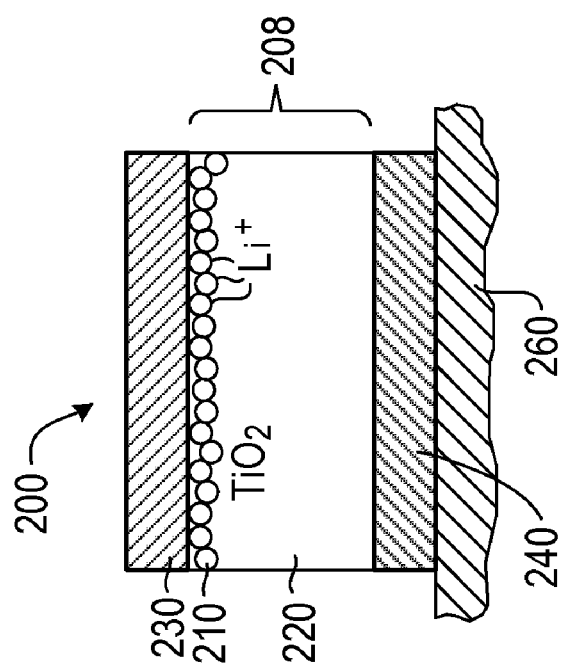

IONIC-MODULATED DOPANT PROFILE CONTROL IN NANOSCALE SWITCHING DEVICES

STATEMENT OF GOVERNMENT INTEREST

This invention has been made with government support under Contract No. HR0011-09-3-0001, awarded by the Defense Advanced Projects Research Agency. The government has certain rights in the invention.

BACKGROUND ART

The continuous trend in the development of electronic devices has been to minimize the sizes of the devices. While the current generation of commercial microelectronics are based on sub-micron design rules, significant research and development efforts are directed towards exploring devices on the nano-scale, with the dimensions of the devices often measured in nanometers or tens of nanometers. Besides the significant reduction of individual device size and much higher packing density compared to microscale devices, nanoscale devices may also provide new functionalities due to physical phenomena on the nanoscale that are not observed on the microscale.

For instance, electronic switching in nanoscale devices using titanium oxide as the switching material has recently been reported. The resistive switching behavior of such a device has been linked to the memristor circuit element theory originally predicted in 1971 by L. O. Chua. The discovery of the memristive behavior in the nanoscale switch has generated significant interest, and there are substantial ongoing research efforts to further develop such nanoscale switches and to implement them in various applications. One of the many important potential applications is to use such a switching device as a memory unit to store digital data.

The devices recently reported using titanium oxide (and other metal oxides) typically have involved two oxide phases ($TiO_2$ and an oxygen-deficient phase, $TiO_{2-x}$). The two oxide phases (or one oxide phase, $TiO_2$, bounded by two oxide phases, $TiO_{2-x}$) are contacted by metal electrodes, typically, Pt, Ru, W, or other suitable metals.

One major issue in developing memristive nanoscale switching devices is that devices based on metal oxides as the switching material always required an "electroforming" process before they can be used for normal switching cycles. The electroforming process involves the one-time application of a relative high voltage or current to produce a significant change of the electronic conductivity of the device. Only after the forming can the device be operated as a tunable resistance switch that can go through repeated ON/OFF cycles. The electro-forming process is not a very well controlled process and is potentially destructive, as the conductivity change is very sudden, and the voltage at which the change occurs varies greatly from device to device. A greater problem, however, is that the formed metal oxide switching devices show a wide variance of operational properties, such as the voltage required for switching the device ON or OFF or to a selected resistance value, and the variations appear to depend on the details of electroforming. The wide variance in operational properties makes it difficult to use the switching devices in applications such as computing circuits. The lack of device repeatability can be a major barrier for the technological implementation of the nanoscale switching devices.

BRIEF DESCRIPTION OF THE DRAWINGS

FIGS. 2A-2C depict a schematic cross-sectional view of a memristor in various stages of operation, in accordance with embodiments of the invention, as follows:

FIG. 2A shows a layer of $Li^+$ ions formed at an interface between an electrode and an active region.

FIG. 2B shows application of voltage to drive $Li^+$ through the device.

FIG. 2C shows reversal of the voltage to return the device to its previous state.

FIG. 4A depicts an alternate embodiment, where the ohmic contact is formed at the interface between the source layer and the top electrode, while the Schottky barrier is formed at the interface between the non-conducting layer and the bottom electrode.

FIG. 4B depicts another alternate embodiment, where the $Li^+$ layer may be formed intermediate the two electrodes.

BEST MODES

Reference is made now in detail to specific embodiments, which illustrates the best mode presently contemplated by the inventors for practicing the invention. Alternative embodiments are also briefly described as applicable.

Figure 1:
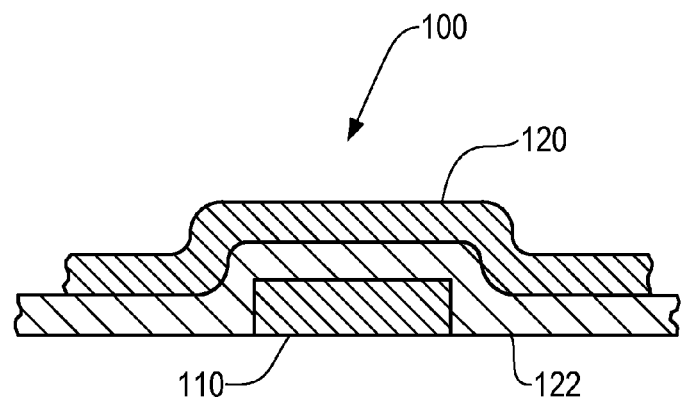
FIG. 1 is a cross-sectional view of a nanoscale switching device in accordance with an embodiment of the invention.

FIG. 1 shows an embodiment of a nanoscale switching device 100 in accordance with the invention that does not require an electroforming process to condition it for normal switching operations. In other words, the device is "electroforming-free." Further, switching voltages are expected to be lower than would be required for electroformed memristors.

The switching device 100 includes a bottom electrode 110 and a top electrode 120, and an active region 122 disposed between the two electrodes. Each of the bottom and top electrodes 110 and 120 is formed of a conducting material and has a width and a thickness on the nanoscale. As used hereinafter, the term "nanoscale" means the object has one or more dimensions smaller than one micrometer. In this regard, each of the electrodes may be in the form of a nanowire. Generally, the active region 122 contains a switching material that is capable of carrying a selected species of dopants such that the dopants can drift through the switching material under a sufficiently strong electric field. The drifting of the dopants results in a redistribution of dopants in the active region, which is responsible for switching behavior of the device, as will be described in greater detail below.

The present invention is directed to the construction of the active region of a nanoscale switching device in such a way that the device does not require electroforming. As mentioned earlier, prior to the present invention, nanoscale switching devices using a metal oxide switching material appeared to always require an initial irreversible electroforming step to put the devices in a state capable of normal switching operations. The electroforming process is typically done by applying a voltage sweep to a relatively high voltage, such as from 0 V up to −20 V for negative forming or 0 V to +10 V for positive forming. The sweep range is set such that device is electroformed before reaching the maximum sweep voltage by exhibiting a sudden jump to a higher current and lower voltage in the I-V curve. The electroforming operation is difficult to control due to the suddenness of the conductivity change. Moreover, the formed devices exhibit a wide variance of operational properties depending on the details of the electroforming.

In connection with the present invention, it has been recognized by the inventors that the electroforming step may be related to a reduction process of the metal oxide switching material. It is believed that the reduction creates oxygen vacancies, which then drift through the switching material under the high electric field, and the drifting may be enhanced by the electrical heating caused by the electroforming voltage and current. The oxygen vacancies drift towards the cathode (the negative electrode) and, as a result, localized conducting channels due to a high concentration of oxygen vacancies are formed within the metal oxide switching material. The formation of such localized conducting channels through the bulk switching material is believed to account for the sudden and drastic reduction of the electrical conductivity of the device. It is also believed that after the electroforming process the ON/OFF switching behavior is concentrated mainly at the interface region of the switching material and one or both of the electrodes.

In accordance with embodiments of the invention, the need for the electroforming operation that creates localized conducting channels within the switching material is effectively eliminated by employing a very thin layer of a highly reactive and highly mobile material. For example, ionic lithium ($Li^+$) is highly reactive and highly mobile. With application of voltage, it is possible to drive more $Li^+$ through a device, such as a memristor. In the case of a memristor comprising a transition metal oxide, such as $TiO_2$, as the active region, $Li^+$ reacts with oxygen in the lattice to create vacancies, thereby providing a method of engineering vacancies in memristive devices.

FIGS. 2A-C show one embodiment of a switching device 200 that is electroforming-free based on the use of lithium ions. As shown in FIG. 2A, the active region 208 of the switching device includes a thin source layer 210, and relatively thicker non-conducting layer 220. The thickness of the source layer 210 is, in some embodiments, on the order of about 1 nm per 50 nm of non-conducting layer 220 thickness, or about 1 to 3 nm. The source layer 210 comprises a source of highly reactive and highly mobile ions, such as $Li^+$. By "highly reactive" is meant that the oxide that is formed by the reaction of $Li^+$ with $TiO_2$ is less stable than the oxide of the non-conducting layer ("matrix oxide", $TiO_2$). Thus, the formed oxide has a lower Gibbs free energy than the matrix oxide. By "highly mobile" is meant that the ion has a sufficiently low energy barrier to move around the matrix. Typically, the smaller the radius and mass of the ion, the higher its mobility. An example of high mobility is Li diffusion in $Li_2CoO$, which is on the order of $10^{11}$ $cm^2/s$.

The non-conducting layer 220 comprises an electronically semiconducting or nominally insulating and a weak ionic conductor. An example of such a material is titanium dioxide ($TiO_2$). The non-conducting layer 220 may be thicker than the source layer 210, but its thickness is not critical. For example, the thickness of the non-conducting layer may range from 10 nm to 150 nm in some embodiments.

The nanoscale switching device 200 can be switched between ON and OFF states by controlling the concentration and distribution of the dopants in the non-conducting layer 220. When a DC switching voltage from a voltage source 250 is applied across the top and bottom electrodes 230 and 240, an electric field is created across the active region 208. This electric field, if of a sufficient strength and proper polarity, may drive the $Li^+$ from the source layer 210 into the non-conducting layer 220, and cause the dopants to drift through the non-conducting material in the non-conducting layer 220 towards the top electrode 230, thereby turning the device 200 into an ON state. This state is depicted in FIG. 2B.

If the polarity of the electric field is reversed, the dopants may drift in an opposite direction across the non-conducting layer 220 and away from the top electrode 230, thereby turning the device 200 into an OFF state. In this way, the switching is reversible and may be repeated. Due to the relatively large electric field needed to cause dopant drifting, after the switching voltage is removed, the locations of the dopants remain stable in the switching material. This state is depicted in FIG. 2C.

The state of the switching device 200 may be read by applying a read voltage to the top and bottom electrodes 230 and 240 to sense the resistance across these two electrodes. The read voltage is typically much lower than the threshold voltage required to cause drifting of the ionic dopants between the top and bottom electrodes, so that the read operation does not alter the ON/OFF state of the switching device.

By way of example, as shown in FIGS. 2A-2C, the non-conducting material may be $TiO_2$ and the source material may be $Li^+$. In this case, $Li^+$ reacts with oxygen in the lattice to create oxygen vacancies ($V_o^{2+}$), thereby providing a method of engineering vacancies in memristive devices. More particularly, the reaction of $Li^+$ with oxygen in the lattice to create oxygen vacancies, also known as dopants, which results in the formation of region 255 of $TiO_{2-x}$, where x may be a number much smaller than 1. The repeatable generation of $TiO_{2-x}$ and return to $TiO_2$ enables the overall resistance of the switching device 200 to be reversibly altered. It is noted that the lithium ions themselves may also diffuse as interstitials.

The switching behavior described above may be based on different mechanisms. In one mechanism, the switching behavior may be an "interface" phenomenon. Initially, with a low dopant level in the non-conducting material 220, the interface of the non-conducting material and the top electrode 230 may behave like a Schottky barrier, with an electronic barrier that is difficult for electrons to tunnel through. As a result, the device has a relatively high resistance. When a switching voltage to turn the device ON is applied, the dopants drift towards the top electrode 230. The increased concentration of dopants in the electrode interface region changes its electrical property from one like a Schottky barrier to one more like an ohmic contact, with a significantly reduced electronic barrier height or width. As a result, electrons can tunnel through the interface much more easily, and this may account for the significantly reduced overall resistance of the switching device. On the other hand, the interface between the bottom electrode 240 and the $Li^+$ layer 210 remains essentially ohmic.

In another mechanism, the reduction of resistance may be a "bulk" property of the switching material in the switching layer. An increase of the dopant level in the switching material causes the resistance across the switching material to fall, and this may account for the decrease of the overall resistance of the device between the top and bottom electrodes. It is also possible that the resistance change is the result of a combination of both the bulk and interface mechanisms. Even though there may be different mechanisms for explaining the switching behavior, it should be noted that the present invention does not rely on or depend on any particular mechanism for validation, and the scope of the invention is not restricted by which switching mechanism is actually at work.

The $Li^+$ layer 210 between the bottom electrode 240 and the non-conducting layer 220 may be formed by a number of processes, including, but not limited to, ion-implantation, electrochemical injection, atomic layer deposition (ALD), sputtering, and organometallic deposition, among others. The bottom electrode 240 may or may not be formed on a substrate 260. If the substrate is employed, it may comprise any common insulating, dielectric materials, such as silica or alumina.

Figure 3:
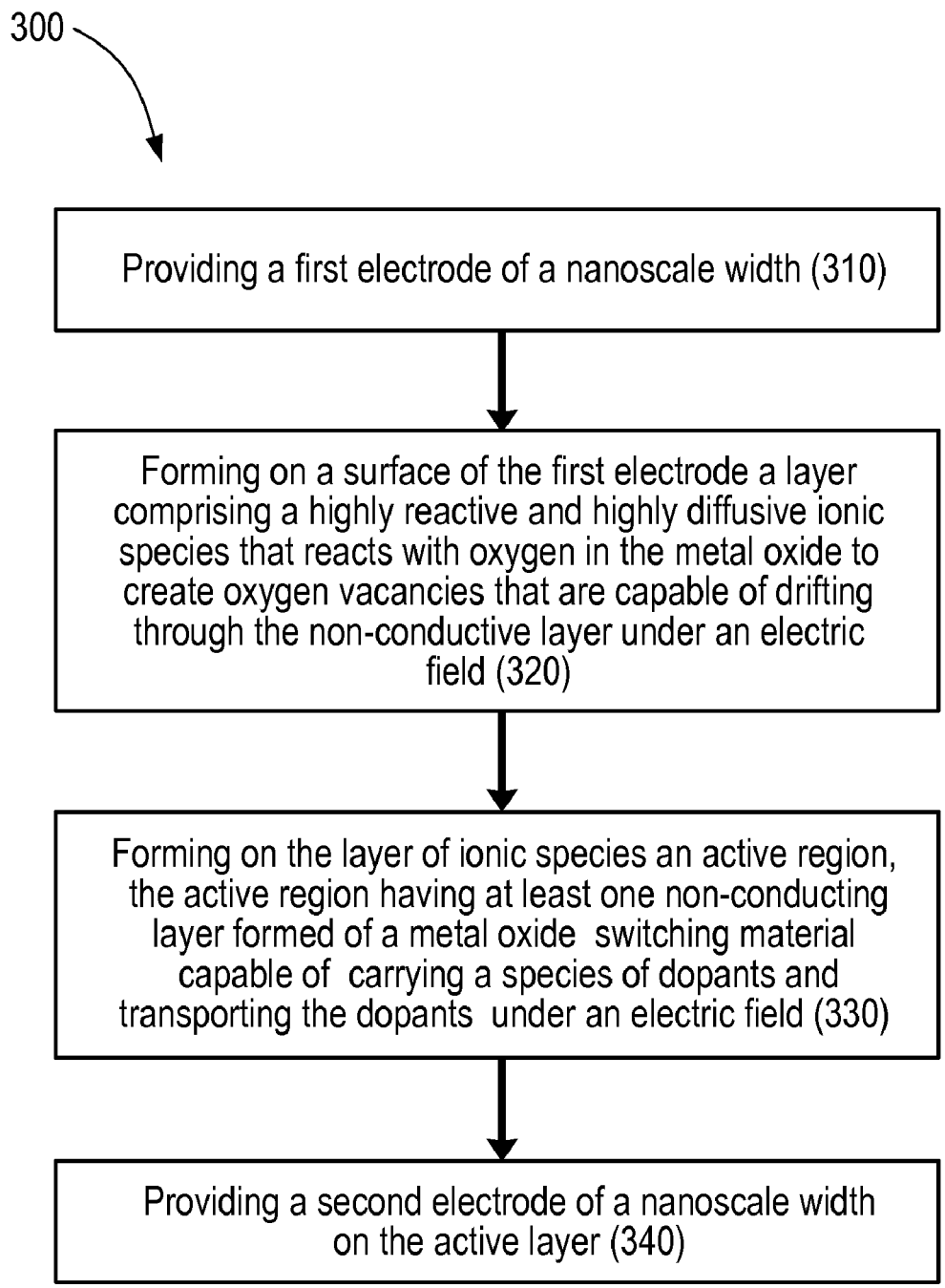
FIG. 3 is a process flow chart for fabricating a memristor in accordance with embodiments disclosed herein.

FIG. 3 is a flow chart of an exemplary process 300 used to form the device 200. First, the bottom electrode 240 is formed (Step 310). The bottom electrode is next coated with a Li layer 210 (Step 320) or other highly reactive, highly mobile ion. The non-conducting layer 220, such as $TiO_2$, or other electronically semiconducting or nominally insulating and a weak ionic conductor, is then formed over the Li layer 210 (Step 330). Finally, the top electrode 230 is formed on the non-conducting layer 220 (Step 340).

The electrodes 230, 240 may comprise any of the common electrode materials, such as Pt, Ru, W, Cu, Al, Si, or any combination thereof, etc., and may be the same or different. The thickness of the electrodes 230, 240 is that commonly employed in the construction of memristors, typically on the order of 10 to 100 nm.

While the discussion above has been directed to forming the $Li^+$ layer 210 on the bottom electrode 240, it is just as feasible to form the $Li^+$ layer 210 on the non-conducting layer 220 and then form the top electrode 230 on the $Li^+$ layer. FIG. 4A depicts this embodiment. Here, the ohmic contact is formed at the interface between the source layer 210 and the top electrode 230, while the Schottky barrier is formed at the interface between the non-conducting layer 220 and the bottom electrode 240.

Further, the $Li^+$ layer may be formed intermediate the two electrodes, as shown in FIG. 4B. This could be done, for example, by depositing a portion of the non-conducting layer 220, then depositing the source layer 210, and then depositing more of the non-conducting layer 220. In this case, a thin conducting layer 270 is formed on the top surface of the bottom electrode 240 or the bottom surface of the top electrode 230 (as shown in phantom) to provide the desired ohmic contact. The interface between the non-conducting layer 220 and the other electrode forms the Schottky barrier. A metal, such as Ti, or a metal-like material, such as $TiO_4O_7$, may be employed as the thin conducting layer 270. The thickness of the conducting layer 270 is in the range of 1 to 30 nm.

The use of $Li^+$ is expected to reduce switching voltages to lower values and to eliminate the need for forming the device. The presence of $Li^+$ provides a mobile reducing agent in these devices.

The foregoing description is based on the use of $TiO_2$ as the non-conducting material 220 and $Li^+$ as the source material 210. However, it will be appreciated that other ions, such as $Ag^+$, $Ru^+$, $Na^+$, $Mg^{++}$, $K^+$, $Ca^{++}$, and $Al^{3+}$ meet the definitions herein of highly reactive and highly mobile. Of course, devising a particular combination of non-conducting material 220 and source material 210 may take some experimentation, but such experimentation is not considered undue, based on the teachings provided herein.

The electroforming issue addressed by the present invention has mainly been observed in switching devices using metal oxides, specifically, multi-valent metal oxides such as $TiO_2$, as the switching material. Nevertheless, the structural configurations of the active region of the switching device in accordance with embodiments of the invention can also be applied to switching devices that use other types of switching materials. In this regard, many different materials with their respective suitable dopants can be used as the switching material. $TiO_2$ is one example of a multi-valent metal oxide that is suitably employed in the practice of the embodiments disclosed herein. Examples of other multivalent metal oxides include, but are not limited to, oxides of Ti, Zr, and Hf; alloys of these three oxides in pairs or with all three present simultaneously (e.g., $Ti_xZr_yHf_zO_2$, where x+y+z=1); titanates, zirconates and hafnates, which may be represented as $ABO_3$ compounds, where A is at least one divalent element and B is at least one of Ti, Zr, and Hf, and the compounds may have the perovskite structure; and alloys of these various compounds, such as $Ca_aSr_bBa_cTi_xZr_yHf_zO_3$, where a+b+c=1 and x+y+z=1. Still further multi-valent metal oxides include vanadates, niobates, tantalates, molybdates, tungstates, etc.

In addition to metal oxides, materials that exhibit suitable properties for memristive switching include, for example, sulfides, carbides, selenides, nitrides, phosphides, arsenides, chlorides, and bromides of transition and rare earth metals. Suitable switching materials also include elemental semiconductors such as Si and Ge, and compound semiconductors such as III-V and II-VI compound semiconductors. The III-V semiconductors include, for instance, BN, BP, BSb, AlP, AlSb, GaAs, GaP, GaN, InN, InP, InAs, and InSb, and ternary and quaternary compounds. The II-VI compound semiconductors include, for instance, CdSe, CdS, CdTe, ZnSe, ZnS, ZnO, and ternary compounds. These listings of possible switching materials are not exhaustive and do not restrict the scope of the present invention.

The dopant species used to alter the electrical properties of the switching material depends on the particular type of switching material chosen, and may be cations, anions or vacancies, or impurities as electron donors or acceptors. For instance, in the case of transition metal oxides such as $TiO_2$, the dopant species may be oxygen vacancies. For GaN, the dopant species may be nitride vacancies or sulfide ions. For compound semiconductors, the dopants may be n-type or p-type impurities.

Figure 5:
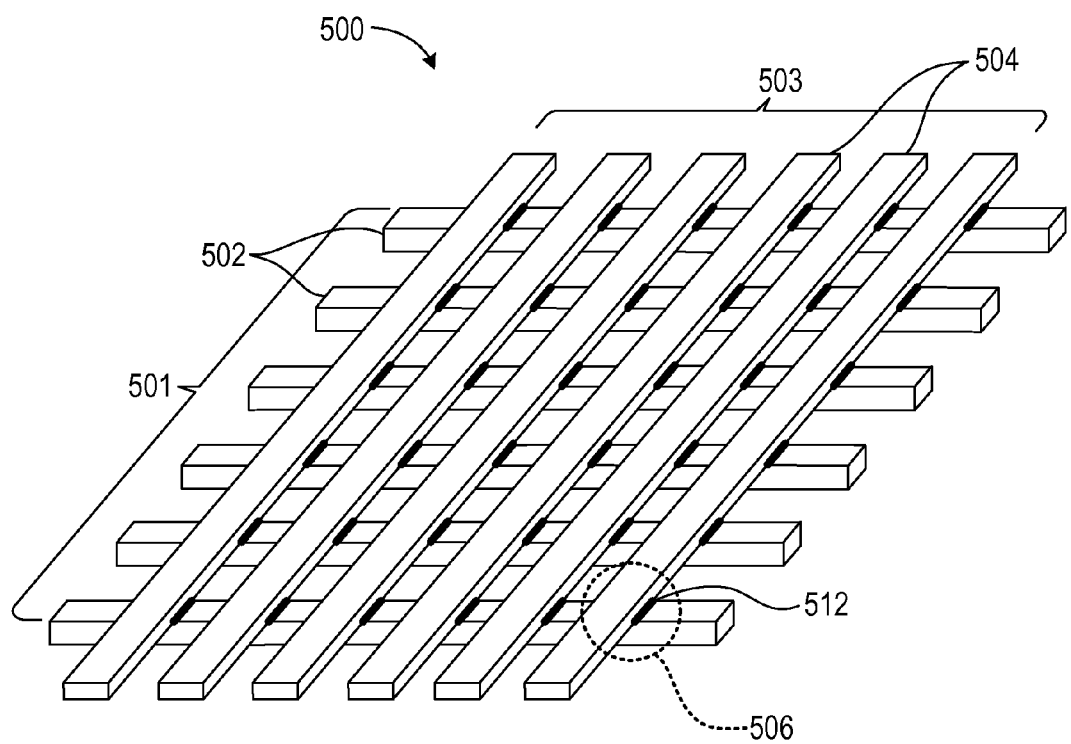
FIG. 5 is a schematic cross-sectional view of a crossbar array of electro-forming-free nanoscale switching devices in accordance with an embodiment of the invention.

The electroforming-free stable nanoscale switching device 200 may be formed into an array for various applications. FIG. 5 shows an example of a two-dimensional array 500 of such switching devices. The array 500 has a first group 501 of generally parallel nanowires 502 running in a first direction, and a second group 503 of generally parallel nanowires 504 running in a second direction at an angle, such as 90 degrees, from the first direction. The two layers of nanowires 502 and 504 form a two-dimensional lattice which is commonly referred to as a crossbar structure, with each nanowire 502 in the first layer intersecting a plurality of the nanowires 504 of the second layer. A two-terminal switching device 506 may be formed at each intersection of the nanowires 502 and 504. The switching device 506 has a nanowire of the second group 503 as its top electrode and a nanowire of the first group 501 as the bottom electrode, and an active region 512 containing a switching material between the two nanowires. In accordance with an embodiment of the invention, the active region 512 has a switching layer that is capable of normal switching cycles without the need for electroforming, and may have a structure according to an embodiment, such as described above with reference to FIGS. 2A-2C and 4A-4B.

In the foregoing description, numerous details are set forth to provide an understanding of the present invention. However, it will be understood by those skilled in the art that the present invention may be practiced without these details. While the invention has been disclosed with respect to a limited number of embodiments, those skilled in the art will appreciate numerous modifications and variations therefrom. It is intended that the appended claims cover such modifications and variations as fall within the true spirit and scope of the invention.

What is claimed is:

1. A nanoscale switching device, comprising:
a first electrode of a nanoscale width;
a second electrode of a nanoscale width;

an active region disposed between the first and second electrodes, the active region having at least one non-conducting layer comprising an electronically semiconducting or nominally insulating and a weak ionic conductor switching material capable of carrying a species of dopants and transporting the dopants under an electric field; and a source layer interposed between the first electrode and the second electrode and comprising a highly reactive and highly mobile ionic species that reacts with a component in the weak and ionic conductor switching material to create dopants that are capable of drifting through the non-conducting layer under an electric field, thereby controlling dopant profile by ionic modulation, wherein the highly reactive and highly mobile ionic species is selected from the group consisting of lithium, rubidium, sodium, calcium, potassium, and magnesium ions.

2. The nanoscale switching device of claim 1, wherein the highly reactive and highly mobile ionic species is lithium ions and the non-conducting layer comprises $TiO_2$.

3. The nanoscale switching device of claim 1, wherein the thickness of the source layer is in the range of about 1 to 3 nm.

4. The nanoscale switching device of claim 1, wherein the source layer is within the active layer and an additional conducting layer is interposed either between the first electrode and the active region or between the second electrode and the active region to form an ohmic contact with that electrode.

5. The nanoscale switching device of claim 1 wherein the weak and ionic conductor switching material comprises a multi-valent metal oxide.

6. The nanoscale switching device of claim 5, wherein the multi-valent metal oxide is titanium dioxide and the dopants are oxygen vacancies.

7. The nanoscale switching device of claim 1, wherein the source layer is interposed either between the first electrode and the active region or between the second electrode and the active region to make electrical contact with that electrode.

8. The nanoscale switching device of claim 7, wherein the source layer forms an ohmic contact with the first electrode or second electrode and the active region forms a Schottky barrier with the second electrode or the first electrode.

9. A nanoscale crossbar array comprising:
a first group of conducting nanowires running in a first direction;
a second group of conducting nanowires running in a second direction and intersecting the first group of nanowires;
a plurality of switching devices formed at intersections of the first and second groups of nanowires, each switching device having a first electrode formed by a first nanowire of the first group and a second electrode formed by a second nanowire of the second group, and an active region disposed at the intersection between the first and second nanowires, the active region having at least one non-conducting layer comprising an electronically semiconducting or nominally insulating and a weak ionic conductor switching material capable of carrying a species of dopants and transporting the dopants under an electric field; and
a source layer interposed between the first electrode and the second electrode and comprising a highly reactive and highly mobile ionic species that reacts with a component in the weak and ionic conductor switching material to create dopants that are capable of drifting through the non-conducting layer under an electric field, thereby controlling dopant profile by ionic modulation, wherein the highly reactive and highly mobile ionic species is selected from the group consisting of lithium, rubidium, sodium, calcium, potassium, and magnesium ions.

10. The nanoscale crossbar array of claim 9, wherein the source layer is within the active layer and an additional conducting layer is interposed either between the first electrode and the active region or between the second electrode and the active region to form an ohmic contact with that electrode.

11. The nanoscale crossbar array of claim 9, wherein the highly reactive and highly mobile ionic species is lithium ions and the non-conducting layer comprises $TiO_2$.

12. The nanoscale crossbar array of claim 9, wherein the thickness of the source layer is in the range of about 1 to 3 nm.

13. The nanoscale crossbar array of claim 9 wherein the weak and ionic conductor switching material comprises a multi-valent metal oxide.

14. The nanoscale crossbar array of claim 13, wherein the multi-valent metal oxide is titanium dioxide and the dopants are oxygen vacancies.

15. The nanoscale crossbar array of claim 9, wherein the source layer is interposed either between the first electrode and the active region or between the second electrode and the active region to make electrical contact with that electrode.

16. The nanoscale crossbar array of claim 15, wherein the source layer forms an ohmic contact with the first electrode or second electrode and the active region forms a Schottky barrier with the second electrode or the first electrode.

17. A process for making at least one nanoscale switching device, comprising:
providing a first electrode of a nanoscale width;
forming the first electrode a source layer comprising a highly reactive and highly mobile ionic species that reacts with a component in the metal oxide to create dopants that are capable of drifting through a non-conducting layer under an electric field;
forming over the source layer an active region, the active region having at least one non-conducting layer comprising an electronically semiconducting or nominally insulating and a weak ionic conductor switching material capable of carrying a species of dopants and transporting the dopants under an electric field; and
providing a second electrode of a nanoscale width over the active layer,
wherein the first electrode and second electrode are capable of forming the electric field in the active region, and
wherein the highly reactive and highly mobile ionic species is selected from the group consisting of lithium, rubidium, sodium, calcium, potassium, and magnesium ions.

18. The process of claim 17 wherein the ionic species comprises $Li^+$ and the non-conducting layer comprises $TiO_2$.

19. The process of claim 17 wherein either (1) the source layer is formed on a surface of the first electrode, the active layer is formed on a surface of the source layer, and the second electrode is formed on a surface of the active layer, or (2) the active layer is formed on a surface of the first electrode, the source layer is formed on a surface of the active layer, and the second electrode is formed on a surface of the source layer, or (3) a first portion of the active layer is formed on a surface of the first electrode, the source layer is formed on a surface of the first portion of the active layer, a remaining portion of the active layer is formed on a surface of the source layer, a second portion of the active layer is formed on a surface of the source layer, and the second electrode is formed on a surface of the second portion of the active layer.

* * * * *

UNITED STATES PATENT AND TRADEMARK OFFICE
CERTIFICATE OF CORRECTION

| | | |
|---|---|---|
| PATENT NO. | : 8,207,519 B2 | Page 1 of 1 |
| APPLICATION NO. | : 12/763091 | |
| DATED | : June 26, 2012 | |
| INVENTOR(S) | : Janice H Nickel et al. | |

It is certified that error appears in the above-identified patent and that said Letters Patent is hereby corrected as shown below:

In the Claims:

In column 8, line 49, in Claim 18, delete "Li+and" and insert -- Li+ and --, therefor.

Signed and Sealed this
First Day of January, 2013

David J. Kappos
*Director of the United States Patent and Trademark Office*